(12) United States Patent
Larson

(10) Patent No.: US 7,342,805 B2
(45) Date of Patent: Mar. 11, 2008

(54) CAPACITOR PLATE FOR SUBSTRATE COMPONENTS

(75) Inventor: Thane M. Larson, Roseville, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 205 days.

(21) Appl. No.: 10/659,452

(22) Filed: Sep. 10, 2003

(65) Prior Publication Data

US 2004/0045161 A1     Mar. 11, 2004

Related U.S. Application Data

(63) Continuation of application No. 09/860,904, filed on May 18, 2001, now Pat. No. 6,643,916.

(51) Int. Cl.
H05K 7/02     (2006.01)
H05K 7/06     (2006.01)
H05K 7/08     (2006.01)
H05K 7/10     (2006.01)

(52) U.S. Cl. .................... 361/780; 361/763; 361/803; 361/306.1

(58) Field of Classification Search ............. 361/306.1, 361/313, 760, 803; 174/250–262; 29/852–854
See application file for complete search history.

(56) References Cited

U.S. PATENT DOCUMENTS

| | | | |
|---|---|---|---|
| 3,721,941 A | 3/1973 | Wisser | |
| 4,636,918 A | 1/1987 | Jodoin | |
| 5,786,979 A * | 7/1998 | Douglass | 361/328 |
| 6,097,609 A | 8/2000 | Kabadi | |
| 6,098,282 A * | 8/2000 | Frankeny et al. | 29/852 |
| 6,272,020 B1 | 8/2001 | Tosaki et al. | |
| 6,414,850 B1 | 7/2002 | Kozak et al. | |
| 6,608,259 B1 * | 8/2003 | Norskov | 174/261 |

* cited by examiner

Primary Examiner—Tuan T. Dinh

(57) ABSTRACT

A method and apparatus to mount a capacitor plate to a substrate, under a component. One embodiment of the invention involves a method to assemble a capacitor plate on a substrate. A second embodiment of the invention involves a method to fabricate a capacitor plate. A third embodiment of the invention involves an assembled substrate with a capacitor plate on the second side of the assembled substrate, under an electrical contact area of a component on the first side of the assembled substrate.

11 Claims, 6 Drawing Sheets

CAPACITOR PLATE FOR SUBSTRATE COMPONENTS

CROSS-REFERENCE TO RELATED APPLICATION

This application is related to the U.S. Patent Application entitled "Data Capture Plate for Substrate Components," filed on May 18, 2001, by the common assignee, which is hereby incorporated by reference. This application is a continuation of patent application having Ser. No. 09/860,904, filed May 18, 2001 now U.S. Pat. No. 6,643,916, which is hereby fully incorporated herein by reference. Benefit of all earlier filing dates is claimed for all common subject matter.

BACKGROUND OF THE INVENTION

1. Field of the Invention

This invention relates generally to a capacitor plate to provide decoupling capacitance for a substrate with integrated circuit (IC) components, and more specifically relates to a capacitor plate for a printed circuit board assembled with one or more land grid array (LGA) or ball grid array (BGA) IC components.

2. Description of the Prior Art

In many data processing systems (e.g., computer systems, programmable electronic systems, telecommunication switching systems, control systems, and so forth) very large pin count electrical components (e.g., application specific integrated circuits and processor chips) are assembled on substrates (e.g., printed circuit boards, other flexible substrates, multi-chip modules, and equivalents). One type of packaging that is frequently used for a very large pin count electrical component is what is commonly known as a LGA component. Electrical connections between the LGA component pins and the corresponding conductive pads on the substrate are frequently achieved by compressing an elastomeric insulating material containing several perpendicular conductive channels (e.g., vias filled with conductive balls or conductive threads). In order to achieve reliable electrical connection between the pins and the pads, these LGA components are typically clamped by metal brackets and bolts to the substrate. BGA components are soldered to the substrate, and do not need clamping.

As the operating frequencies of LGA components, BGA components, and other IC components increase, switching current transients can cause voltage fluctuations on the power and ground lines, and produce switching noise on the power and ground lines seen by the IC components. Decoupling capacitance is typically provided on the substrate to reduce these voltage fluctuations on the power and ground lines. Ideally, the decoupling capacitance is distributed among the IC components, as close to the IC components as possible.

One method to add distributed capacitance to a substrate is by adding a thin-core dielectric material to the substrate. However, this dielectric material is usually limited to a couple of layers, and the cost of a large substrate (e.g., a PCB) increases dramatically because the entire substrate has the extra dielectric layers. Furthermore, each power layer added to a substrate reduces the number of signal layers available for signal routing between components on the substrate.

Another method that is more common is the attachment of decoupling capacitors 112 on the substrate 104 outside the footprint perimeter of an IC component 106. FIG. 1 illustrates decoupling capacitors 112 assembled on a printed circuit board (PCB) 104, outside the perimeter of a LGA or BGA component 106 assembled on the PCB 104. A LGA component 106 is electrically connected to the substrate 104 through the substrate electrical contact area 108 and an interposer (e.g., a socket, an elastomeric pad with conductive vias, or an equivalent connector) 110. Alternatively, a BGA component (not shown) is soldered to the substrate 104. The substrate 104 also has a substrate electrical contact area 102 that is normally used for In-Circuit Testing (ICT) of the assembled substrate.

However, attaching capacitors to a substrate outside the footprint perimeter of IC components increases the inductance that is seen by the IC component pins, and reduces the filtering of high frequency noise on the power and ground lines of the substrate seen by the IC component. Without an improved decoupling capacitance with a relatively low inductance, discrete decoupling capacitors with relatively high inductance will limit the effectiveness of the decoupling capacitance on substrates as the IC component operating frequencies increase, possibly resulting in operational failures and reduced reliability for the IC components and the substrate.

It would be desirable to provide an improved capacitance that can supply the necessary decoupling capacitance, and minimize the fluctuations in voltage levels seen by an IC component on the substrate.

SUMMARY OF THE INVENTION

The present invention provides a capacitor plate that can supply the necessary decoupling capacitance to IC components on a substrate.

A first aspect of the invention is directed to a method to assemble a capacitor plate to one side of a substrate having a first side with a first electrical contact area, and a second side with a second electrical contact area. The method includes connecting a component to the first electrical contact area on the first side of said substrate; and connecting the capacitor plate to the second electrical contact area on the second side, opposite the first electrical contact area on the first side of the substrate.

A second aspect of the invention is directed to a method to fabricate a capacitor plate. The method includes selecting a set of physical specifications of the capacitor plate; estimating an initial required capacitance for a plurality of contacts on the capacitor plate; modeling the capacitor plate after assembly on a substrate; estimating a more precise required capacitance for the plurality of contacts on the capacitor plate after modeling the capacitor plate after assembly on the substrate; and fabricating the capacitor plate according to the set of physical specifications.

A third aspect of the invention is directed to an assembled substrate. The assembled substrate has a first side and a second side, and a first electrical contact area on the first side and a second electrical contact area on the second side; an electrical component having a plurality of leads electrically connected to the first electrical contact area of the substrate; and a capacitor plate electrically connected to the second electrical contact area on the second side of the substrate substantially opposite the first electrical contact area of the substrate.

These and other objects and advantages of the invention will become apparent to those skilled in the art from the following detailed description of the invention and the accompanying drawings.

DETAILED DESCRIPTION OF PREFERRED EMBODIMENTS OF THE INVENTION

Figure 1:
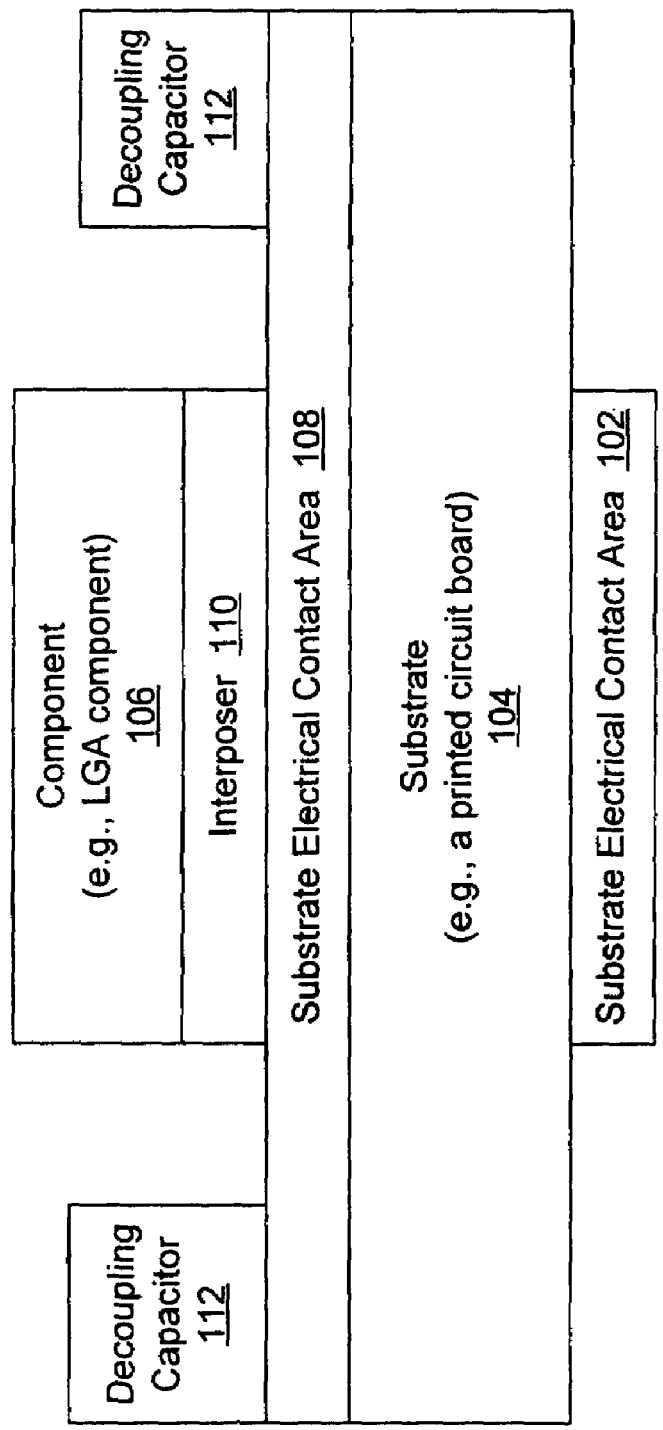
FIG. 1 illustrates decoupling capacitors assembled on a printed circuit board (PCB), outside the perimeter of a LGA or BGA component assembled on the PCB.

The present invention provides a capacitor plate with an improved decoupling capacitance that is closer to the IC components on a substrate. This capacitor plate is attached after an electrical component is mounted on the substrate, such as a printed circuit board (PCB) or multi-chip module. While the discussion below is directed to an application of the invention to a land grid array (LGA) or ball grid array (BGA) component assembled on a substrate (e.g., a PCB), the invention can also be applied to other types of electrical components assembled on other substrates (e.g., multi-chip modules, and other substrates upon which electrical components needing additional capacitors can be assembled).

A capacitor plate assembly is a passive, loadable, PCB structure that adds decoupling capacitance to the pads typically found in a LGA or BGA component pattern. Originally designed to take advantage of test-points used for In-Circuit Testing (ICT) testing, the capacitor plate assembly locates decoupling capacitance near the power pins of large LGA or BGA components as closely as physically possible. Since stray inductance is the primary reason for a reduction in the effectiveness of discrete decoupling capacitors at higher frequencies, shortening the electrical distance from the decoupling capacitors to the power and ground pins dramatically improves the decoupling capacitance.

The capacitor plate is designed to have very high, distributed capacitance with a relatively lower inductance than is present with assembled discrete capacitors. For example, a capacitance of ~6 nanoFarads (nF)/inch$^2$ (~1 nF/cm$^2$) can be achieved with a parallel plate structure of 20 layers of power planes and ground planes separated by layers of 3 mils thick standard PCB fiberglass (FR4). Fewer layers, or alternatively a higher capacitance board, can be achieved with a dielectric material with a higher dielectric constant (e.g., EmCap® dielectric material, having a relative permittivity ($\epsilon_r$) approximately equal to 50, available from Sanmina Corporation, with corporate headquarters in San Jose, Calif.; and Semiconductor Supercapacitor System ($S_3$) material, available from Energenius, Inc., with corporate headquarters in North York, Ontario, Canada). In alternative embodiments, in addition to the parallel capacitor plate structure, discrete capacitors can be loaded on one side of the capacitor plate to provide additional decoupling capacitance.

The mechanical construction for LGA attachment is a pressure fit, solder-less one in which a socket (e.g, a Thomas and Betts socket available from Thomas and Betts, with corporate headquarters in Memphis, Tenn.; or an equivalent socket) is used. This allows the capacitor plate assembly to be added in the final stages of assembly, after the ICT process. The capacitor plate assembly has the advantage of adding capacitance directly where it is needed without affecting the cost or route-ability of the main PCB itself Furthermore, it has a better high-frequency affect than discrete capacitors. Finally, the capacitor plate assembly takes advantage of the PCB test-point area under the LGA or BGA components that are normally a "waste of space" after the ICT process finishes. The capacitor plate assembly can be loaded after the ICT process finishes, and can take advantage of that open board area.

Figure 2:
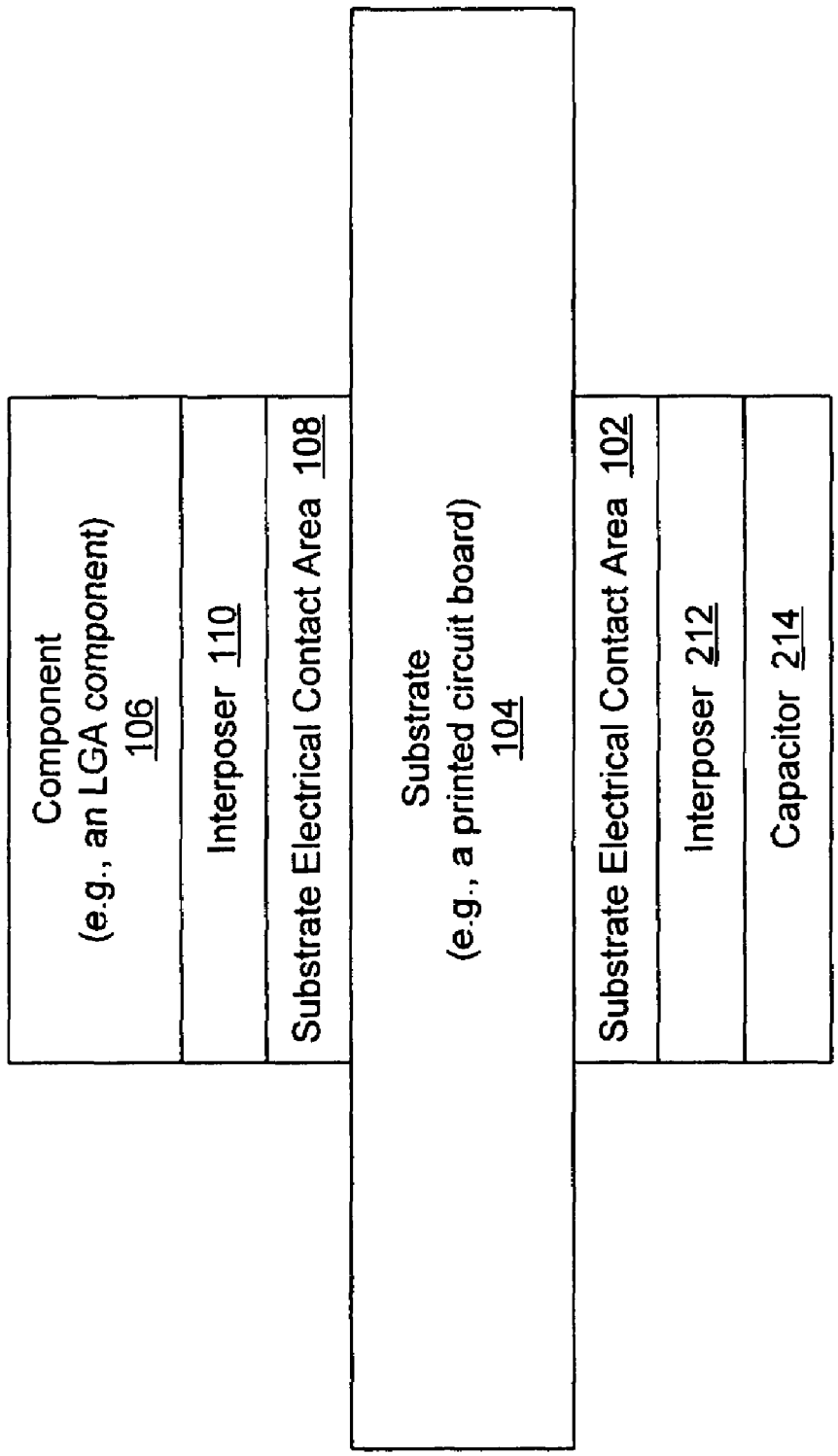
FIG. 2 illustrates a substrate and capacitor plate assembly according to one embodiment of the invention.

FIG. 2 illustrates a substrate and capacitor plate assembly according to one embodiment of the invention. Here, an LGA component 106 is assembled on a substrate 104, and electrically connected to the substrate 104 through an interposer 110 {e.g., a socket, an elastomeric pad (e.g., a rubber, a plastic, or an equivalent polymeric material) with conductive vias, or an equivalent connector} and a substrate electrical contact area 108. On the other side of the substrate 104 is a capacitor plate 214 electrically connected to the substrate 104 through an interposer 212 and a substrate electrical contact area 102. Alternatively, the capacitor plate 214 can be directly soldered to the substrate 104.

The component 106 is assembled first, with the substrate electrical contact area 102 used for the ICT process of the assembled substrate. After the ICT process is completed, the substrate electrical contact area can be used for the connection of the capacitor plate 214 and interposer 212.

Figure 3:
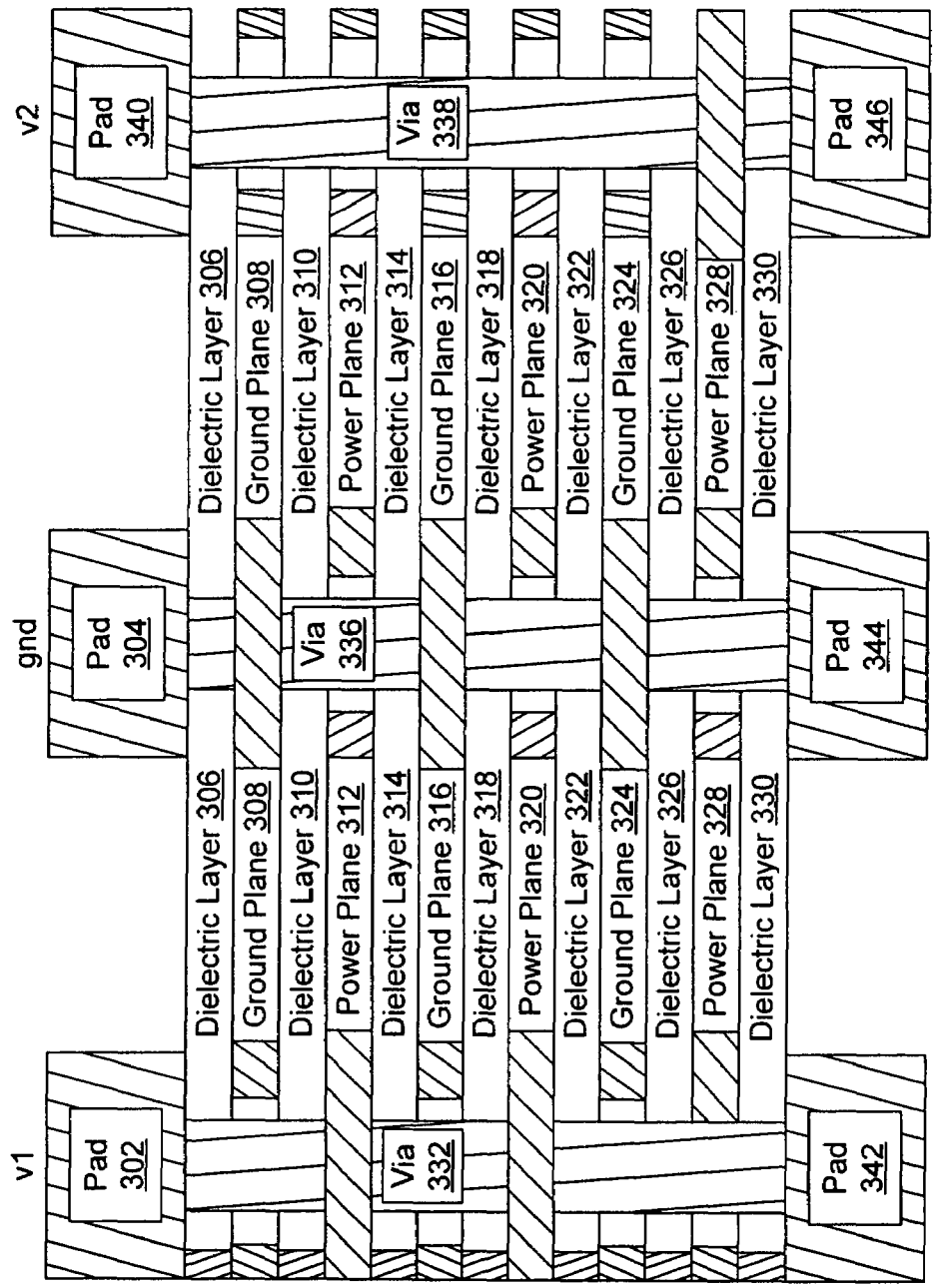
FIG. 3 illustrates one embodiment of a capacitor plate composed of alternating layers of dielectric layers, conductive ground planes, and conductive power planes.

FIG. 3 illustrates one embodiment of a capacitor plate 214 composed of alternating layers of dielectric layers 306, 310, 314, 318, 322, 326, and 330; ground planes 308, 316, and 324; and power planes 312, 320, and 328. Contact pads 302 and 342 are connected by via 332 to power planes 312 and 320; contact pads 304 and 344 are connected by via 336 to ground planes 308, 316, and 324; and contact pads 340 and 346 are connected by via 338 to power plane 328. Since power planes 312 and 320 are surrounded by dielectric layers 310, 314, 318, and 322 which in turn are surrounded by ground planes 308, 316 and 324, the decoupling capacitance created between contact pad 302 and contact pad 304 is twice as much as would be created if the contact pad 302 was only connected to power plane 312.

The capacitor plate 214 is fabricated from alternating layers of conductors and dielectric layers chosen from the following materials: FR4, a resin, an elastomeric material (e.g., a rubber, a plastic, or an equivalent polymeric material), or a ceramic. One preferred embodiment of the invention has a capacitor plate fabricated from alternating layers of copper and FR4. In another embodiment, the capacitor plate 214 includes a metal reinforcement layer to counteract a large perpendicular clamping force to provide flatness and rigidity to the PCB 104, and provide a uniform load distribution across the contact region of a LGA component 106.

Figure 4:
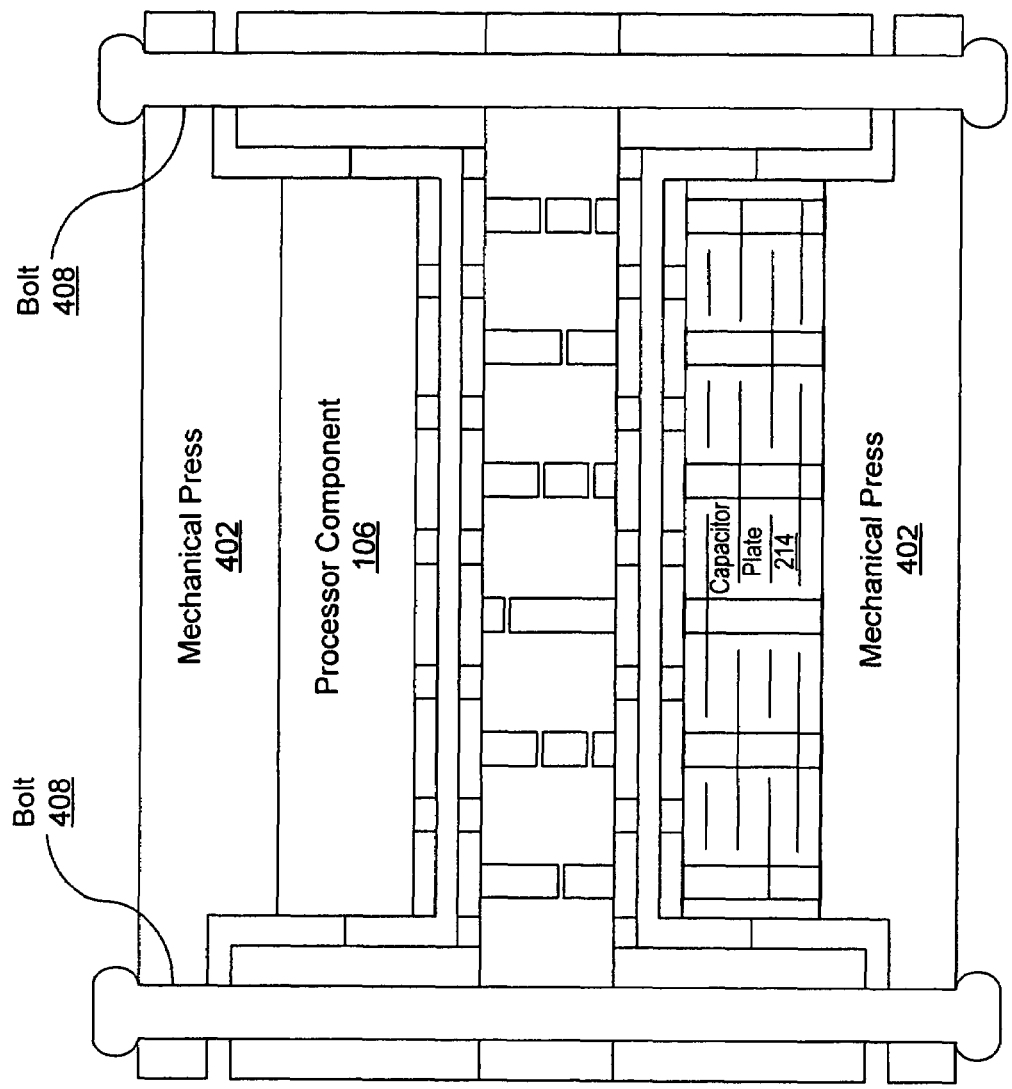
FIG. 4 illustrates one embodiment of a capacitor plate and a processor component clamped by a mechanical press into Thomas and Betts sockets on opposite sides of a substrate, according to one embodiment of the invention.

FIG. 4 illustrates one embodiment of a capacitor plate 214 and a processor component 106 clamped by a mechanical press 402 into Thomas and Betts sockets 404 and 406 on opposite sides of a PCB substrate 104, according to one embodiment of the invention. The mechanical press 402 includes bolts 408 that are inserted through the PCB substrate 104.

Figure 5:
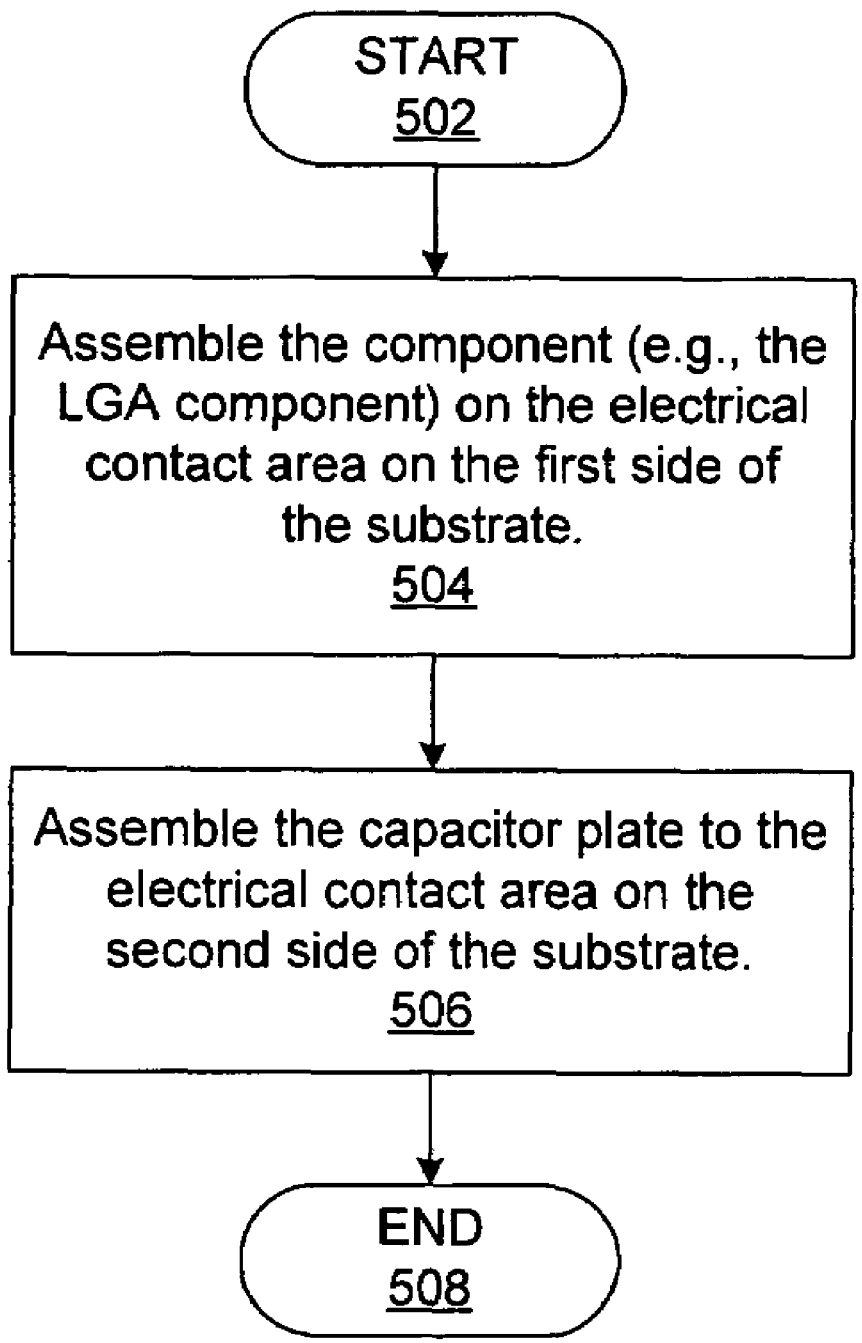
FIG. 5 shows one flow chart for a method to assemble a capacitor plate on a substrate as shown in FIG. 2 in accordance with one embodiment of the present invention.

FIG. 5 shows one flow chart for a method to assemble a capacitor plate on a substrate as shown in FIG. 2 in accordance with one embodiment of the present invention. The method starts in operation 502, and is followed by operation 504. In operation 504, a component is attached to the electrical contact area on one side of the substrate. For example, a LGA component is electrically connected to the substrate by an interposer. Alternatively, a BGA component is electrically connected to the substrate by re-flowing solder on corresponding pads of the substrate. Operation 506 is next, where a capacitor plate is attached to the other side of the substrate, and the capacitor plate is attached opposite an electrical contact area on the other side of the substrate. Operation 508 is the end of the method.

Figure 6:
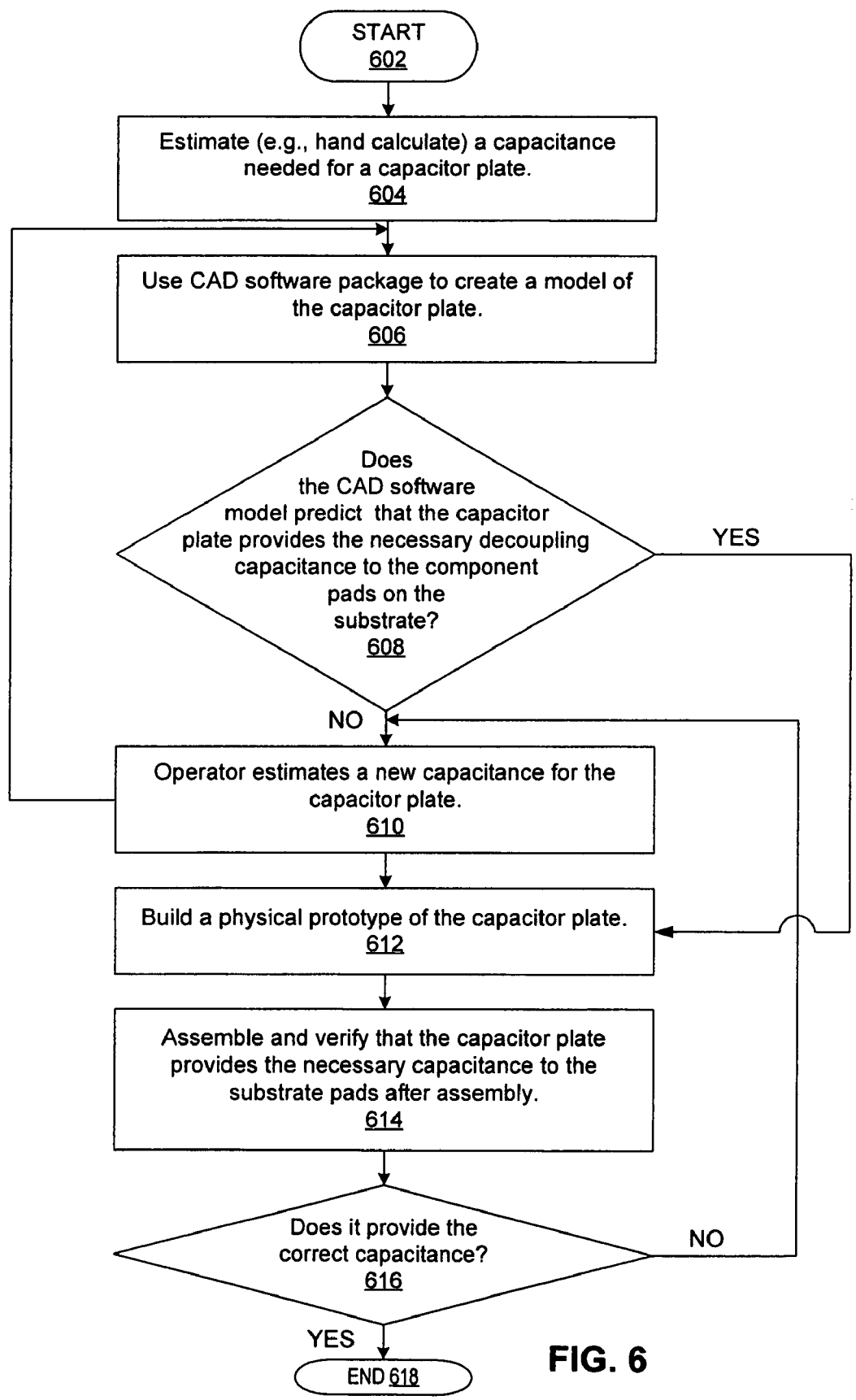
FIG. 6 shows a flow chart for a method to fabricate a capacitor plate in accordance with one preferred embodiment of the present invention.

FIG. 6 shows a flow chart for a method to fabricate a capacitor plate in accordance with one preferred embodiment of the present invention. The method starts in operation 602, and is followed by operation 604. In operation 604, a hand calculation is made of the capacitance that needs to be provided by the capacitor plate when it is assembled on a substrate. In operation 606, a 3-D computer aided design (CAD) software package (e.g., PSpice®, available from Cadence Design Systems, Inc., with corporate headquarters at San Jose, Calif.; or an equivalent CAD package) is used to create an electrical model of the capacitor plate. Then operation 608 is next. In operation 608, a test is made to determine if the CAD software package predicts that that the capacitor plate provides the necessary decoupling capacitance for the contact pads under the IC component after assembly. If the test of operation 608 determines that the capacitor plate will not provide the correct decoupling capacitance, operation 610 is next where the operator decides on a new capacitance for the capacitor plate. Then operations 606 and 608 are repeated. If the test of the operation 608 determines that the capacitor plate will provide the correct capacitance for decoupling the contact pads of the IC component, then operation 612 is next. In operation 612 a physical prototype of the capacitor plate is fabricated. Operation 614 is next, where the capacitor plate is assembled to the substrate to verify that the capacitor plate will provide the necessary capacitance to the contact pads on the substrate under the IC component. Then operation 616 is next, where a test is made to determine if the capacitor plate provides the correct capacitance. If the test of operation 616 verifies that capacitor plate does not provide the correct capacitance, then operation 610 is next. If the test of operation 616 verifies that the capacitor plate provides the correct capacitance, then the method ends in operation 618.

The embodiments of the invention discussed above mainly described examples of substrates assembled with capacitor plates with decoupling capacitance for LGA or BGA components. However, alternative embodiments of the invention can be applied to other components (e.g., unclamped IC components, clamped IC components, transformers, power supplies, connectors, or other devices that can benefit from having close capacitors).

The exemplary embodiments described herein are for purposes of illustration and are not intended to be limiting. Therefore, those skilled in the art will recognize that other embodiments could be practiced without departing from the scope and spirit of the claims set forth below.

What is claimed is:

1. An assembled substrate, comprising:
 a substrate having a first side and a second side, and a first electrical contact area on said first side and a second electrical contact area on said second side;
 an electrical component having a plurality of leads electrically connected to said first electrical contact area of said substrate; and
 a capacitor plate electrically connected to said second electrical contact area on said second side of said substrate substantially opposite said first electrical contact area of said substrate;
 wherein the capacitor plate has a selected capacitance value that provides decoupling capacitance to the leads, and wherein each ground plane in the capacitor plate is disposed between a first pair of dielectric layers and each power plane in the capacitor plate is disposed between a second pair of dielectric layers, and wherein a first contact pad is connected to the ground plane and a second contact pad is connected to the power plane, and wherein the capacitor plate comprises a top surface that includes a first dielectric layer and a bottom surface that includes a second dielectric layer,
 wherein said assembled substrate further comprises:
 a first interposer between said component and said first electrical contact area on said first side of said substrate; and
 a second interposer between said capacitor plate and said second electrical contact area on said second side of said substrate.

2. The assembled substrate of claim 1, wherein said first interposer and said second interposer are chosen from a group consisting of: a socket, or a conductive elastomeric material.

3. The assembled substrate of claim 1, wherein said substrate is chosen from a group consisting of: a PCB, an MCM, and a flexible substrate.

4. The assembled substrate of claim 1, wherein said component is chosen from a group consisting of: an LGA component, or a BGA component.

5. The assembled substrate of claim 1, wherein said capacitor plate has a plurality of layers of dielectric material separating a plurality of layers of conductive material.

6. The assembled substrate of claim 1, wherein said capacitor plate comprises:
 a plurality of conductive power planes; and
 a plurality of conductive ground planes, wherein said plurality of conductive power planes and said plurality of conductive ground planes are separated by one or more dielectric layers including a dielectric layer chosen from the materials comprising at least one of: FR4, a resin, an elastomeric material, or a ceramic.

7. The assembled substrate of claim 1, wherein said capacitor plate is attached by solder to said second electrical contact area on said second side of said substrate.

8. The assembled substrate of claim 1, wherein the capacitor plate is fabricated by a method comprising: estimating a capacitance for the capacitor plate; creating an electrical model of the capacitor plate as assembled on the substrate; determining if the electrical model predicts that the capacitor plate provides the required decoupling capacitance for contact pads under the electrical component; estimating a new capacitance for the capacitor plate, if the capacitor plate does not provide the required decoupling capacitance; building a prototype of the capacitor plate; assembling the capacitor plate on the substrate; and testing if the capacitor plate provides a correct capacitance after assembling the capacitor plate on the substrate.

9. The assembled substrate of claim 1, wherein the capacitor plate is fabricated by a method comprising: estimating an initial required capacitance for a plurality of contacts on the capacitor plate; modeling the capacitor plate as assembled on the substrate; estimating a more precise required capacitance for a plurality of contacts on the capacitor plate after modeling the capacitor plate; and fabricating the capacitor plate according to the more precise required capacitance for the plurality of contacts.

10. The assembled substrate of claim 1, further comprising: a clamp for clamping the capacitor plate and the component to the substrate.

11. The assembled substrate of claim 1, wherein an electrical model is created by a computer aided design software.

* * * * *